(12) United States Patent
Zhang et al.

(10) Patent No.: US 10,019,934 B2
(45) Date of Patent: Jul. 10, 2018

(54) PIXEL STRUCTURE AND A PREPARATION METHOD THEREOF, A PIXEL DISPLAY METHOD AND AN ARRAY SUBSTRATE

(71) Applicant: BOE TECHNOLOGY GROUP CO., LTD., Beijing (CN)

(72) Inventors: Bin Zhang, Beijing (CN); Zhanfeng Cao, Beijing (CN); Xiangchun Kong, Beijing (CN); Qi Yao, Beijing (CN); Jincheng Gao, Beijing (CN); Zhengliang Li, Beijing (CN); Xiaolong He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 14/892,521

(22) PCT Filed: Apr. 14, 2015

(86) PCT No.: PCT/CN2015/076559
§ 371 (c)(1),
(2) Date: Nov. 19, 2015

(87) PCT Pub. No.: WO2016/101442
PCT Pub. Date: Jun. 30, 2016

(65) Prior Publication Data
US 2016/0358539 A1 Dec. 8, 2016

(30) Foreign Application Priority Data
Dec. 24, 2014 (CN) .......................... 2014 1 0818586

(51) Int. Cl.
*G09G 3/32* (2016.01)
*H01L 27/32* (2006.01)

(52) U.S. Cl.
CPC ............... *G09G 3/32* (2013.01); *H01L 27/32* (2013.01); *G09G 2320/0646* (2013.01)

(58) Field of Classification Search
None
See application file for complete search history.

(56) References Cited

U.S. PATENT DOCUMENTS 8,310,442 B2* 11/2012 Hagood ............... G09G 3/3433
345/108
2011/0157676 A1 6/2011 Yoon et al.
(Continued)

FOREIGN PATENT DOCUMENTS

CN 101749602 6/2010
CN 102236165 11/2011
(Continued)

OTHER PUBLICATIONS

Chinese Office Action with English Language Translation, dated May 31, 2016, Chinese Application No. 201410818586.2.
(Continued)

*Primary Examiner* — Joseph Haley
*Assistant Examiner* — Emily Frank
(74) *Attorney, Agent, or Firm* — Womble Bond Dickinson (US) LLP

(57) ABSTRACT

The present disclosure discloses a pixel structure and a preparation method thereof, a pixel display method and an array substrate. The pixel structure comprises: a thin film transistor TFT for controlling a Micro-Electro-Mechanical System MEMS switch; the Micro-Electro-Mechanical System MEMS switch being used for controlling transmission amount of outgoing light of a quantum dot light emitting diode QLED device; the quantum dot light emitting diode QLED device being a top emission type for emitting light constantly based on a constant light emitting driving signal.

17 Claims, 4 Drawing Sheets

(56) References Cited

U.S. PATENT DOCUMENTS

| | | | | |
|---|---|---|---|---|
| 2012/0154455 A1* | 6/2012 | Steyn | G02B 26/02 345/690 |
| 2012/0320342 A1* | 12/2012 | Richards | G09G 3/002 353/30 |
| 2013/0093741 A1* | 4/2013 | Akimoto | G09G 5/00 345/211 |
| 2014/0029077 A1* | 1/2014 | Mao | G02B 26/02 359/230 |
| 2014/0036536 A1* | 2/2014 | Gettemy | G02B 26/02 362/612 |
| 2014/0077178 A1* | 3/2014 | Seo | H01L 27/3258 257/40 |
| 2015/0037916 A1* | 2/2015 | Rohatgi | H01L 51/524 438/28 |
| 2015/0084928 A1* | 3/2015 | Wyrwas | G06F 3/0421 345/175 |
| 2015/0192634 A1* | 7/2015 | Lewis | G01R 31/2621 324/762.09 |
| 2017/0221032 A1* | 8/2017 | Mazed | G06K 7/10722 |

FOREIGN PATENT DOCUMENTS

| | | |
|---|---|---|
| CN | 102280546 | 12/2011 |
| CN | 102809814 | 12/2012 |
| CN | 202855736 | 4/2013 |
| CN | 103971629 | 8/2014 |
| CN | 104464632 | 3/2015 |
| CN | 204288767 | 4/2015 |
| JP | 2012108494 | 6/2012 |
| TW | 552720 | 9/2003 |
| WO | WO-2008076448 | 6/2008 |

OTHER PUBLICATIONS

International Search Report and Written Opinion with English Language Translation, dated Sep. 9, 2015, Application No. PCT/CN2015/076559.

* cited by examiner

PIXEL STRUCTURE AND A PREPARATION METHOD THEREOF, A PIXEL DISPLAY METHOD AND AN ARRAY SUBSTRATE

FIELD OF THE DISCLOSURE

The present disclosure relates to the field of display technology, particularly to a pixel structure and a preparation method thereof, a pixel display method and an array substrate.

BACKGROUND OF THE DISCLOSURE

The quantum dot (QD) may also be called nanocrystalline, it is a nanoparticle consisting of II-VI family or III-V family elements, since electrons and holes are confined by quanta, successive energy band structures become discrete energy level structures having molecular properties, which can emit fluorescent light after being excitated, the luminescent spectrum thereof can be controlled by changing the size of the quantum dot, the fluorescent intensity and stability are both good, which is a perfect electroluminescent material. There is a great variety of quantum dots, which are represented by CdS, CdSe, CdTe, ZnO, ZnS, ZnSe, ZnTe of II-VI family and GaAs, GaP, GaAs, GaSb, HgS, HgSe, HgTe, InAs, InP, InSb, AlAs, AlP, AlSb of III-V family.

At present, the quantum dot as a display material has been widely used in the field of display, for example, quantum dot light emitting display (QLED) manufactured by using quantum dots as the luminescent material. The structure used by the existing QLED display is similar as the organic light emitting display (OLED), which controls the cathode of the QLED display device in the QLED display through the on-off action of the TFT, so as to control the QLED display device to emit light or not emit light, i.e., controlling flicker of the QLED display device. However, the QLED display of the prior art has the following problems: the existing QLED display controls the frequent flicker of the QLED display device through constant change of the driving current, hence, it may result in unbalance of injection of charges (i.e., the number of injected electrons and holes is unbalanced), repetition of this process for a long time may result in chemical dissociation of the quantum dots (e.g., oxidation/deoxidization) thereby property change may occur, such that the life time of the QLED display device is reduced; moreover, the way of controlling the cathode of the QLED display device in the QLED display through on-off action of the TFT to realize change of the driving current so as to control flicker of the QLED display device has the problem that the current control is unstable, which requires a complex compensation circuit to compensate the current, hence, the difficulty for preparation of the QLED display device of the prior art is great.

SUMMARY OF THE DISCLOSURE

The object of the present disclosure is to provide a pixel structure and a preparation method thereof, a pixel display method and an array substrate, so as to solve the problems that the life time of the existing QLED display device is short and the difficulty of the preparation process is great.

The embodiment of the present disclosure provides a pixel structure, comprising:

a thin film transistor (TFT) for controlling a Micro-Electro-Mechanical System (MEMS) switch;

the Micro-Electro-Mechanical System (MEMS) switch being used for controlling transmission amount of outgoing light of a quantum dot light emitting diode (QLED) device;

the quantum dot light emitting diode (QLED) device being a top emission type for emitting light constantly based on a constant light emitting driving signal.

In the embodiment of the present disclosure, the MEMS switch is added in the pixel structure, the TFT controls the working state of the MEMS switch so as to control transmission amount of outgoing light of the QLED device.

Optionally, the drain electrode of the TFT is electrically connected with the MEMS switch, the TFT, after being turned on, controls the MEMS switch based on a signal received by a source electrode of itself. In this embodiment, the working state of the MEMS switch is changed or adjusted based on the on/off state of the TFT and the received signal, thereby controlling transmission amount of outgoing light of the QLED device.

Optionally, the MEMS switch comprises a connecting portion and a switch portion, the connecting portion being electrically connected with the drain electrode of the TFT, the switch portion being arranged at a side in a light emission direction of the QLED device to control light amount of the outgoing light of the QLED device. In this embodiment, the switch portion of the MEMS switch is arranged in the light emission direction of the QLED device, such that it can control the light amount of the outgoing light of the QLED device based on its switching amplitude.

Optionally, the pixel structure further comprises light shielding bars, the light shielding bars being located below an edge of a side of the MEMS switch close to the QLED device. In the embodiment of the present disclosure, the light shielding bars can shield light leakage of the MEMS switch and avoid display abnormity.

Optionally, the pixel structure further comprises a first conductive structure through which first conductive structure the MEMS switch is electrically connected with the drain electrode of the TFT.

Optionally, an insulating layer is arranged between the drain electrode of the TFT and the connecting portion of the MEMS switch, the first conductive structure is electrically connected with the drain electrode of the TFT through a first via hole on the insulating layer. In the embodiment of the present disclosure, the first via hole formed on the insulating layer enables the first conductive structure and the drain electrode to realize electrical connection.

Optionally, the light shielding bars and the first conductive structure are arranged in the same layer and are insulated from each other, materials of the first conductive structure and the light shielding bars are metal materials. In the embodiment of the present disclosure, the light shielding bars and the first conductive structure are arranged in the same layer, which can save working processes in preparation.

The beneficial effect of the embodiment of the present disclosure is as follows: when the display device works, the TFT controls the working state of the MEMS switch, so as to control transmission amount of outgoing light of the QLED device, avoid frequent flicker of the QLED device, and increase the life time of the QLED device.

The embodiment of the present disclosure provides an array substrate comprising a plurality of pixel units arranged in an array, each of the pixel units adopts a pixel structure provided by the above embodiments.

The beneficial effect of the embodiment of the present disclosure is as follows: when the display device works, the QLED device is enabled to emit light constantly, the TFT controls the working state of the MEMS switch, so as to control transmission amount of outgoing light of the QLED device, avoid frequent flicker of the QLED device, and increase the life time of the QLED device.

The embodiment of the present disclosure provides a method for preparing a pixel structure, comprising:

forming, on a substrate, a thin film transistor (TFT) and a top emission type quantum dot light emitting diode (QLED) device adjacent to the TFT;

forming, on the substrate on which the above step is performed, a Micro-Electro-Mechanical System (MEMS) switch comprising a connecting portion and a switch portion, enabling the connecting portion of the MEMS switch to be electrically connected with a drain electrode of the TFT, and enabling the switch portion of the MEMS to be formed above the QLED.

Optionally, after forming the TFT on the substrate, it further comprises:

forming an insulating layer comprising a first via hole over the TFT, and forming, on the substrate, a first region spaced apart from the TFT; wherein the position of the first via hole corresponds to the position of the drain electrode of the TFT.

Optionally, it further comprises forming a first conductive structure electrically connected with the drain electrode of the TFT over the insulating layer;

enabling the connecting portion of the MEMS switch to be electrically connected with the drain electrode of the TFT is specifically: enabling the connecting portion of the MEMS switch to be electrically connected with the drain electrode of the TFT through the first conductive structure.

Optionally, before forming a MEMS switch comprising a connecting portion and a switch portion, it further comprises:

forming light shielding bars above the QLED, the light shielding bars being located below an edge of a side of the MEMS switch close to the QLED device.

The beneficial effect of the embodiment of the present disclosure is as follows: the MEMS switch in added in the pixel structure, the MEMS switch is electrically connected with the drain electrode of the TFT; when the display device works, the QLED device is enabled to emit light constantly, the TFT controls the working state of the MEMS switch, so as to control transmission amount of outgoing light of the QLED device, avoid frequent flicker of the QLED device, and increase the life time of the QLED device.

The embodiment of the present invention provides a pixel display method, comprising:

a quantum dot light emitting diode (QLED) device emitting light constantly based on driving of a constant light emitting driving signal;

a thin film transistor (TFT) controlling a working state of a Micro-Electro-Mechanical System (MEMS) switch, to enable the MEMS switch to control transmission amount of outgoing light of the QLED device, so as to realize pixel display.

Optionally, the TFT controlling the working state of the MEMS switch to enable the MEMS switch to control transmission amount of outgoing light of the QLED device comprises:

transmitting an image data signal received by a source electrode of the TFT to the connecting portion of the MEMS switch via the drain electrode of the TFT and the first conductive structure successively, to enable the switch portion of the MEMS switch to open a switching amplitude matching with the image data signal, so as to control light amount of outgoing light of the QLED device.

The beneficial effect of the embodiment of the present disclosure is as follows: the MEMS switch in added in the pixel structure, the MEMS switch is electrically connected with the drain electrode of the TFT; when the display device works, the QLED device is enabled to emit light constantly, the TFT controls the working state of the MEMS switch, so as to control transmission amount of outgoing light of the QLED device, avoid frequent flicker of the QLED device, and increase the life time of the QLED device.

REFERENCE SIGNS

Figure 1:
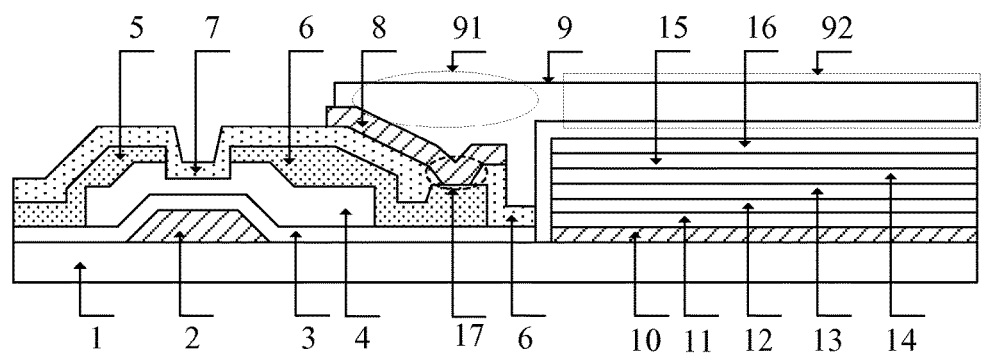
FIG. 1 is a schematic view of a sectional structure of a first pixel structure provided by the embodiment of the present disclosure.

Substrate 1; gate electrode 2; gate insulating layer 3; active layer 4; source electrode 5; drain electrode 6; insulating layer 7; passivation layer 71; first conductive structure 8; MEMS switch 9; anode 10; hole injection layer 11; hole transport layer 12; QLED light emitting layer 13; electron transport layer 14; electron injection layer 15; cathode 16; first via hole 17; light shielding bar 18; first electrode 19; second electrode 20.

DETAILED DESCRIPTION OF THE DISCLOSURE

Next, the implementing process of the embodiments of the present disclosure will be explained in detail with reference to the drawings of the description. It should be noted that the same or similar signs represent the same or similar elements or elements with the same or similar functions all through. The following embodiments described with reference to the drawings are exemplary, which are only used for explanations of the present disclosure, while cannot be understood as limitations to the present disclosure.

In order to avoid frequent flicker of the QLED device in the pixel structure and increase the life time of the QLED device, the embodiment of the present disclosure provides a pixel structure, comprising: a thin film transistor (TFT) for controlling a Micro-Electro-Mechanical System (MEMS)

switch; the Micro-Electro-Mechanical System (MEMS) switch being used for controlling transmission amount of outgoing light of a quantum dot light emitting diode (QLED) device; the quantum dot light emitting diode (QLED) device being a top emission type for emitting light constantly based on a constant light emitting driving signal. It should be noted that "constant light emitting" in the embodiment of the present disclosure is not limited to absolute constant light emitting, nor means that the QLED device is in the bright state all the time and not turned off, the "constant" here is respect to the flicker light emitting mode of the QLED device, the intensity of the driving signal is relatively constant when the pixel is driven to emit light, it is not necessary to realize different gray scale display of the pixel through the strength of the drying signal. The QLED device adapted for "constant light emitting" provides a MEMS switch that can control transmission amount of outgoing light of the quantum dot QLED device, the MEMS switch can, based on the control of the TFT, not transmit the outgoing light of the QLED device, or transmit part of the outgoing light of the QLED device, or transmit all outgoing light of the QLED device, such that the pixel structure can provide the same function of performing different gray scale display as flicker light emitting of the QLED device when the QLED device is in the state of "constant light emitting", in this embodiment, the MEMS switch can be an adjustable optical grating or light valve, the optical grating or light valve can control the width of the opened gap by the TFT so as to control the amount of the outgoing light. The TFT can be a bottom gate type, a top gate type or other structures, the TFT at least one of the source electrode and the drain electrode electrically connected with the MEMS switch, so that the TFT drives the open state or open amplitude of the MEMS switch based on the strength of the driving signal so as to adjust the amount of light transmission.

Optionally, the drain electrode of the TFT is electrically connected with the MEMS switch, the TFT, after being turned on, controls the MEMS switch based on a signal received by a source electrode of itself. In this embodiment, the MEMS switch is electrically connected with the drain electrode of the TFT, thereby realizing control of the MEMS switch by the TFT. Certainly, for different types of TFT, the source electrode of the TFT can also be electrically connected with the MEMS switch, since the TFT can generally be turned on bidirectionally, it does not influence the implementation of the present disclosure either the source electrode or the drain electrode of the TFT being electrically connected with the MEMS switch, which will not be repeated here.

Optionally, the MEMS switch comprises a connecting portion and a switch portion, the connecting portion being electrically connected with the drain electrode of the TFT, the switch portion being arranged at a side in a light emission direction of the QLED device to control light amount of the outgoing light of the QLED device. In this embodiment, the switch portion of the MEMS switch is arranged in the light emission direction of the QLED device, such that it can control the light amount of the outgoing light of the QLED device based on its switching amplitude.

Optionally, the pixel structure further comprises light shielding bars, the light shielding bars being located below an edge of a side of the MEMS switch close to the QLED device. In the embodiment of the present disclosure, the light shielding bars can shield light leakage of the MEMS switch and avoid display abnormity.

Optionally, the pixel structure further comprises a first conductive structure through which first conductive structure the MEMS switch is electrically connected with the drain electrode of the TFT.

Optionally, an insulating layer is arranged between the drain electrode of the TFT and the connecting portion of the MEMS switch, the first conductive structure is electrically connected with the drain electrode of the TFT through a first via hole on the insulating layer. In the embodiment of the present disclosure, the first via hole formed on the insulating layer enables the first conductive structure and the drain electrode to realize electrical connection. It should be noted that for TFTs of different structures, the insulating layer may be one of a passivation layer, a gate insulating layer or a planarization layer or a combination thereof.

Optionally, the light shielding bars and the first conductive structure are arranged in the same layer and are insulated from each other, materials of the first conductive structure and the light shielding bars are metal materials. In the embodiment of the present disclosure, the light shielding bars and the first conductive structure are arranged in the same layer, which can save working processes in preparation.

In the embodiment of the present disclosure, the pixel structure has a "constant light emitting" QLED device, a MEMS switch controlled by the TFT, the TFT can control the working state of the MEMS switch based on the strength of the driving signal, so that the MEMS switch transmits the outgoing light of the QLED device that meets the requirement and controls the transmission amount of the outgoing light of the QLED device.

In order to describe the pixel structure provided by the embodiment of the present disclosure more clearly, the pixel structure as shown in FIG. 1 is explained as follows:

Embodiment I

Referring to FIG. 1, the pixel structure comprises a thin film transistor (TFT), a quantum dot light emitting diode (QLED) device spaced apart from the TFT, the thin film transistor comprises a gate electrode 2, a gate insulating layer 3, an active layer 4, a source electrode 5, a drain electrode 6 and an insulating layer 7 formed on a substrate 1 successively, a first via hole 17 is formed on the insulating layer 7, the first via hole 17 corresponds to at least part of the drain electrode 6 of the TFT. In the embodiment of the present disclosure, the TFT is a bottom gate type structure, the insulating layer 7 is a passivation layer or a combination of a passivation layer and a planarization layer.

The pixel structure further comprises a first conductive structure 8 formed over the insulating layer 7, the first conductive structure 8 is electrically connected with the drain electrode 6, the first conductive structure 8 is electrically connected with the drain electrode 6 of the TFT through the first via hole 17.

A MEMS switch 9 is formed over the first conductive structure 8, the MEMS switch 9 is electrically connected with the first conductive structure 8; the MEMS switch 9 adjusts the switching amplitude based on the control of on-off of the TFT, so as to control transmission amount of the outgoing light of the QLED device. For example, when the TFT is turned on, the MEMS switch 9 opens a certain amplitude, so that the light of the QLED device penetrates the opened MEMS switch 9 for display, the open degree of the MEMS switch 9 can be determined by the parameter of the signal received by the TFT e.g., the image data signal, for example, if the display brightness to which the image data signal corresponds is high, the open amplitude of the MEMS switch 9 is large, if the display brightness to which the image data signal corresponds is low, the open amplitude of the MEMS switch 9 is small; when the TFT is turned off, the MEMS switch 9 is closed, so that the light of the QLED device cannot penetrate the MEMS switch 9 for display; certainly, it may also take values based on boundary, i.e., enabling the MEMS switch 9 to have only two states, i.e., open and close states, corresponding to the two states, enabling the QLED device to have two states of transmitting light and not transmitting light. It should be noted that the first conductive structure 8 may be made from a metal material or an ITO, it is fabricated using metal in an optional embodiment, so as to achieve the effect of having a good conductivity and signal transfer characteristic. In the embodiment of the present disclosure, the pixel structure is provided with a MEMS switch 9, the TFT switch controls switching of the MEMS switch 9, so as to control display of the QLED device.

Optionally, the MEMS switch 9 comprises a connecting portion 91 and a switch portion 92; the connecting portion 91 covers the first conductive structure 8 at the position of the first via hole 17, the switch portion 92 is arranged at a side in the light emission direction of the QLED device. In the embodiment of the present disclosure, since the MEMS switch 9 can change the switching amplitude of the switching state, the MEMS switch 9, after shielding the QLED device, can control whether the QLED device emits light based on its switching state, and control the transmission amount of the outgoing light of the QLED device based on the switching amplitude, so as to realize display; in an optional embodiment, the connecting portion 91 of the MEMS switch 9 covers the first conductive structure 8 at the position of the first via hole 17, i.e., the area of the connecting portion 91 is greater than the area of the first conductive structure 8, thus it can avoid the first conductive structure 8 from being corrupted and damaged during the subsequent fabricating process.

Optionally, the QLED device comprises an anode 10, a hole injection layer 11, a hole transport layer 12, a QLED light emitting layer 13, an electron transport layer 14, an electron injection layer 15 and a cathode 16 formed on the substrate 1 successively. It should be noted that the QLED device in this embodiment is of a top emission type, the cathode 16 of the QLED device is of a transparent material, the light is transmitted by the cathode 16 of the QLED device and arrives at the switching portion 92 of the MEMS switch 9. In an additional embodiment, the QLED device may also be an inverted bottom emission type QLED device, so as to be adapted for different use requirements.

Figure 2:
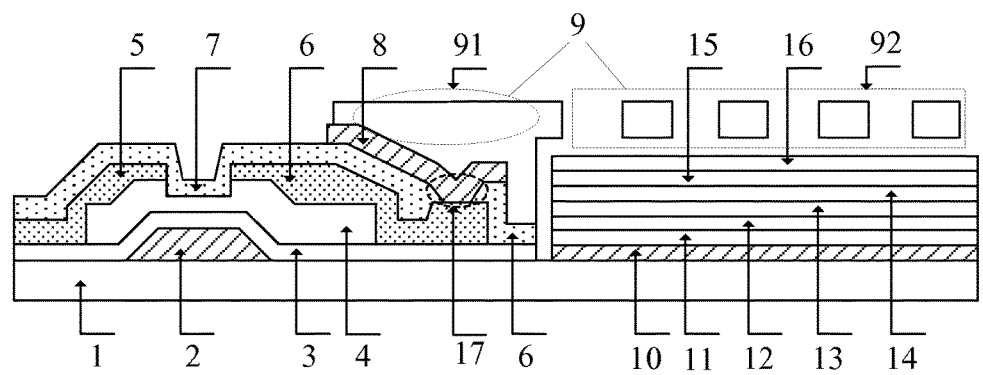
FIG. 2 is a schematic view of a sectional structure of a second pixel structure provided by the embodiment of the present disclosure.

It should be noted that the specific structure of the switch portion 92 of the MEMS switch 9 can be a grating valve, or other adjustable light transmissive structures with unlimited shapes such as a grid; in an optional embodiment, the gratings of the grating valve may be arranged in various directions, including angles formed with the TFT from the source electrode to the drain electrode direction between 0 to 90 degrees (referring to the drawings, i.e., substantially 0 degree in the case as shown in FIG. 1, substantially 90 degrees in the case as shown in FIG. 2), such as the switch portion 92 in the sectional schematic view of the pixel structure as shown in FIG. 2.

Figure 3:
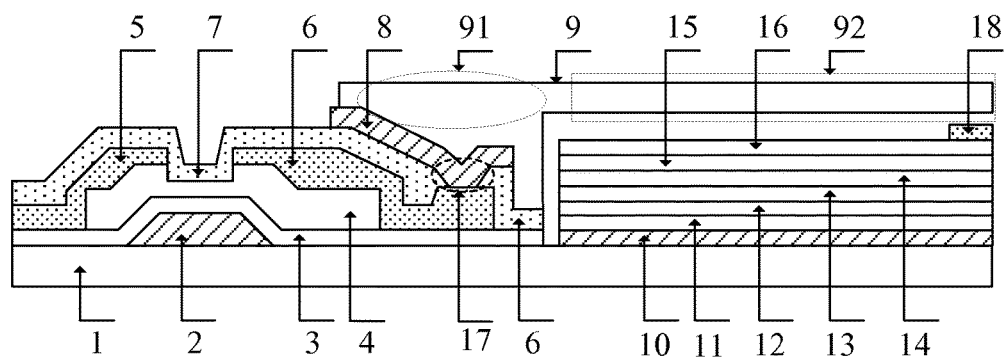
FIG. 3 is a schematic view of a sectional structure of a third pixel structure provided by the embodiment of the present disclosure.
Figure 7:
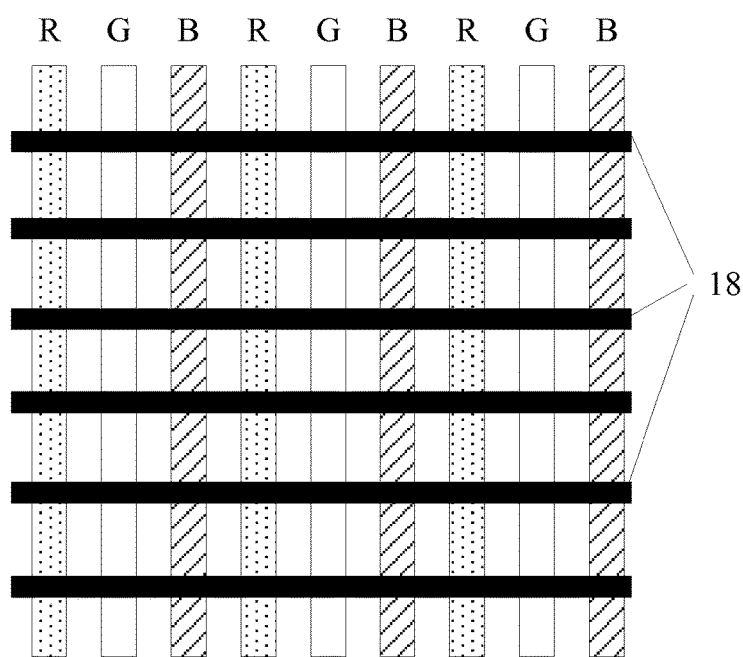
FIG. 7 is a schematic view of light shielding bars and color resistances provided by the embodiment of the present disclosure.

In an optional embodiment, in order to avoid the MEMS switch 9 from generating light leakage at the edge when shielding the QLED device, light shielding bars can also be added on the basis of the pixel structure as shown in FIG. 1. The pixel structure as shown in FIG. 3 differs from the pixel structure as shown in FIG. 1 in that: light shielding bars 18 are arranged at the edge of the cathode 16 of the QLED device, the material of the light shielding bars 18 may be any material with the light shielding function, e.g., metal, black matrix material, or other resin materials in which light shielding substances are added; in an optional embodiment, the light shielding bars 18 and the first conductive structure 8 are arranged in the same layer and are insulated from each other with, specifically, the light shielding bars 18 and the first conductive structure 8 are formed in the same patterning process using the same material, thus the patterning process such as one exposure can be saved, which reduces the cost and optimizes the fabricating process. FIG. 7 shows a schematic view of the light shielding bars 18 and the color resistances, the color resistances include for example R, G, B color resistances, or combination of other colors such as R, G, B W, certainly, the R, G, B color resistances are not limited to the arrangement manner as shown in FIG. 7, various arrangement and layout can be performed based on needs; in an optional embodiment, the light shielding bars 18 are connected together on a row or a column of pixels for shielding light leakage at the edge of the MEMS switch 9; in another preferred embodiment, the light shielding bars 18 are not limited only to shield light to one edge of the pixel, for example, when the shape of the pixel is substantially a rectangle, the light shielding bars 18 can be arranged at any position of the edge of the pixel for shielding light, preferably, the light shielding bars 18 are at least arranged at the edge of a side of the pixel opposite to the TFT, the light shielding effect of which is better. In a further preferred embodiment, the light shielding bars 18 are also electrically connected with a cathode signal source for providing an electrical signal for the cathode, thereby improving the luminous effect of the QLED device.

The beneficial effect of the embodiment of the present disclosure is as follows: a MEMS switch is added in the pixel structure, the MEMS switch is electrically connected with the first conductive structure, the first conductive structure is electrically connected with the drain electrode of the TFT through the first via hole, thereby enabling the MEMS switch to be electrically connected with the drain electrode of the TFT; when the display device works, the QLED device emits light constantly, the TFT controls the light emission amount of the outgoing light of the QLED device by controlling the switching amplitude of the MEMS switch, so as to avoid frequent flicker of the QLED device and increase the life time of the QLED device; The display of the QLED display device is controlled through switching of the MEMS switch, hence, the current compensation is not needed to adjust the brightness of the QLED display device, the complex current compensation circuit can be omitted, so that the preparation difficulty of the QLED device is reduced.

Embodiment II

Figure 4:
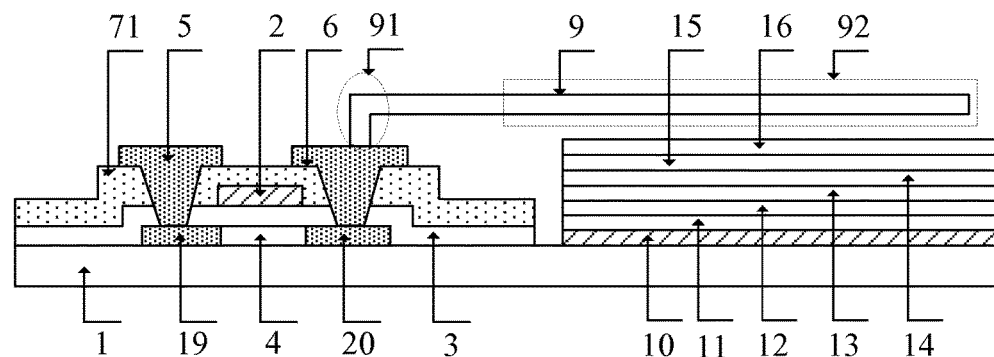
FIG. 4 is a schematic view of a sectional structure of a fourth pixel structure provided by the embodiment of the present disclosure.

Referring to FIG. 4, another pixel structure is provide, the pixel structure comprising a thin film transistor (TFT), a quantum dot light emitting diode (QLED) device spaced apart from the TFT, the thin film transistor comprises an ohmic contact layer, an active layer 4, a gate insulating layer 3, a gate electrode 2, a passivation layer 71 and a source-drain electrode metal layer formed on a substrate 1 successively; The ohmic contact layer comprises a first electrode 19 and a second electrode 20, the source-drain metal layer comprises a source electrode 5 and a drain electrode 6. The TFT is a top gate type structure, compared with the above bottom gate type TFT, this embodiment is not a simple transformation and replacement from the bottom gate type to the top gate type, this optional embodiment uses a TFT of the top gate type structure which enables the connecting portion 91 to contact with the drain electrode 6 directly when fabricating the MEMS switch, which simplifies the fabricating process, avoids fabricating steps and reduces the cost.

The pixel structure further comprises a MEMS switch 9 electrically connected with the drain electrode 6, the MEMS switch 9 comprising a connecting portion and a switch portion, the connecting portion 91 being electrically connected with the drain electrode of the TFT switch, the switch portion 92 shielding the QLED device. It should be noted that in the embodiment of the present disclosure, the insulating layer over the TFT is omitted. The connecting portion 91 of the MEMS switch 9 is in direct contact with the drain electrode 6 of the TFT switch to realize electrical connection. The MEMS switch 9 adjusts the switching amplitude based on the on-off control of the TFT, so as to control the transmission amount of outgoing light of the QLED device. For example, when the TFT is turned on, the MEMS switch 9 opens a certain amplitude, so that the light of the QLED device penetrates the opened MEMS switch 9 for display, the open amplitude of the MEMS switch 9 can be determined by the parameter of the image data signal, for example, if the display brightness to which the image data signal corresponds is high, the open amplitude of the MEMS switch 9 is large, if the display brightness to which the image data signal corresponds is low, the open amplitude of the MEMS switch 9 is small; when the TFT is turned off, the MEMS switch 9 is closed, so that the light of the QLED device cannot penetrate the MEMS switch 9 for display; certainly, it may also take values based on boundary, i.e., enabling the MEMS switch 9 to have only two states, i.e., maximum amplitude and close states, corresponding to the two states, enabling the outgoing light of the QLED device to have a maximum transmission amount and not transmit light.

Optionally, the QLED device comprises an anode 10, a hole injection layer 11, a hole transport layer 12, a QLED light emitting layer 13, an electron transport layer 14, an electron injection layer 15 and a cathode 16 formed on the substrate 1 successively. It should be noted that the QLED device is of a top emission type, the cathode 16 of the QLED device is of a transparent material, the light is transmitted by the cathode 16 of the QLED device and arrives at the switch portion 92 of the MEMS switch 9.

Figure 5:
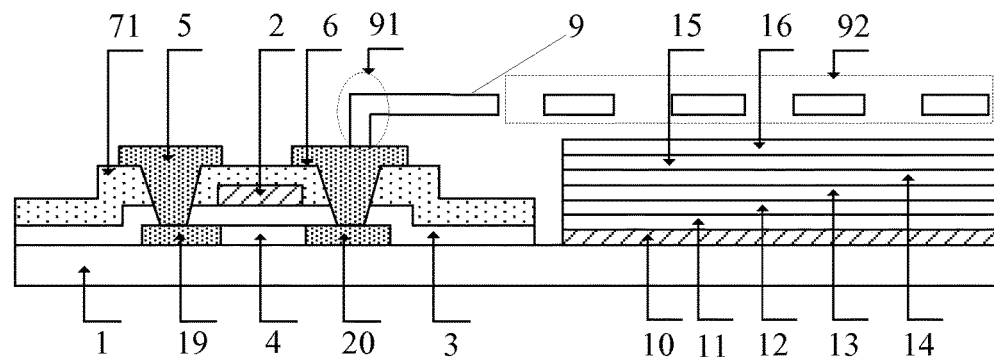
FIG. 5 is a schematic view of a sectional structure of a fifth pixel structure provided by the embodiment of the present disclosure.

It should be noted that the specific structure of the switch portion 92 of the MEMS switch 9 can be a grating valve, or other adjustable light transmissive structures with unlimited shapes such as a grid; in an optional embodiment, the gratings of the grating valve may be arranged in various directions, including angles formed with the TFT from the source electrode to the drain electrode direction between 0 to 90 degrees, such as the switch portion 92 in the sectional schematic view of the pixel structure as shown in FIG. 5.

Figure 6:
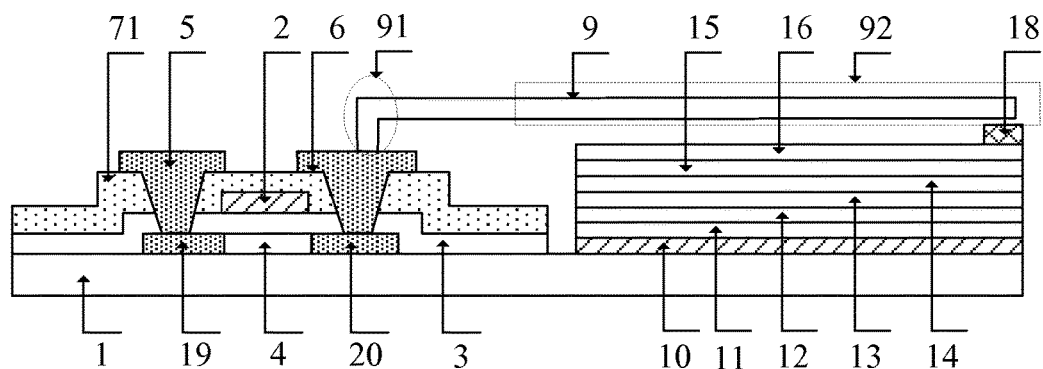
FIG. 6 is a schematic view of a sectional structure of a sixth pixel structure provided by the embodiment of the present disclosure.

In an optional embodiment, in order to avoid the MEMS switch 9 from generating light leakage at the edge when shielding the QLED device, light shielding bars can also be added on the basis of the pixel structure as shown in FIG. 1. The pixel structure as shown in FIG. 6 differs from the pixel structure as shown in FIG. 4 in that: light shielding bars 18 are arranged at the edge of the cathode 16 of the QLED device, the light shielding bars 18 are located below the switch portion 92 of the MEMS switch 9, the material of the light shielding bars 18 may be any material with the light shielding function, e.g., metal, black matrix material, or other resin materials in which light shielding substances are added. FIG. 7 shows a schematic view of the light shielding bars 18 and the color resistances, the color resistances include for example R, G, B color resistances, or combination of other colors such as R, G, B W, certainly, the R, G, B color resistances are not limited to the arrangement manner as shown in FIG. 7, various arrangement and layout can be performed based on needs, for example, the color resistances to which the R, G, B, W sub-pixels that belong to the same pixel are arranged in a 2×2 matrix; in an optional embodiment, the light shielding bars 18 are connected together on a row or a column of pixels for shielding light leakage at the edge of the MEMS switch 9; in another preferred embodiment, the light shielding bars 18 are not limited only to shield light to one edge of the pixel, for example, when the shape of the pixel is substantially a rectangle, the light shielding bars 18 can be arranged at any position of the edge of the pixel for shielding light, preferably, the light shielding bars 18 are at least arranged at the edge of a side of the pixel opposite to the TFT, the light shielding effect of which is better. In a further preferred embodiment, the light shielding bars 18 are also electrically connected with a cathode signal source for providing an electrical signal for the cathode, thereby improving the luminous effect of the QLED device.

The beneficial effect of the embodiment of the present disclosure is as follows: a MEMS switch is added in the pixel structure, the MEMS switch is electrically connected with the first conductive structure; when the display device works, the QLED device emits light constantly, the TFT controls the light emission amount of the outgoing light of the QLED device by controlling the switching amplitude of the MEMS switch, so as to avoid frequent flicker of the QLED device and increase the life time of the QLED device; The display of the QLED display device is controlled through switching of the MEMS switch, hence, the current compensation is not needed to adjust the brightness of the QLED display device, the complex current compensation circuit can be omitted, so that the preparation difficulty of the QLED device is reduced.

Embodiment III

The embodiment of the present disclosure provides an array substrate comprising a plurality of pixel units arranged in an array, each pixel unit adopts a pixel structure provided by the above embodiment.

Optionally, for the consideration of simplifying the fabricating process and saving the working procedure, the QLED of each column of pixel can be made as a whole, i.e., according to the corresponding arrangement manner of the R, G, B color resistances as shown in FIG. 7.

The beneficial effect of the embodiment of the present disclosure is as follows: a MEMS switch is added in the pixel structure, the MEMS switch is electrically connected with the first conductive structure; when the display device works, the QLED device emits light constantly, the TFT controls the light emission amount of the outgoing light of the QLED device by controlling the switching amplitude of the MEMS switch, so as to avoid frequent flicker of the QLED device and increase the life time of the QLED device; The display of the QLED display device is controlled through switching of the MEMS switch, hence, the current compensation is not needed to adjust the brightness of the QLED display device, the complex current compensation circuit can be omitted, so that the preparation difficulty of the QLED device is reduced.

Embodiment IV

Figure 8:
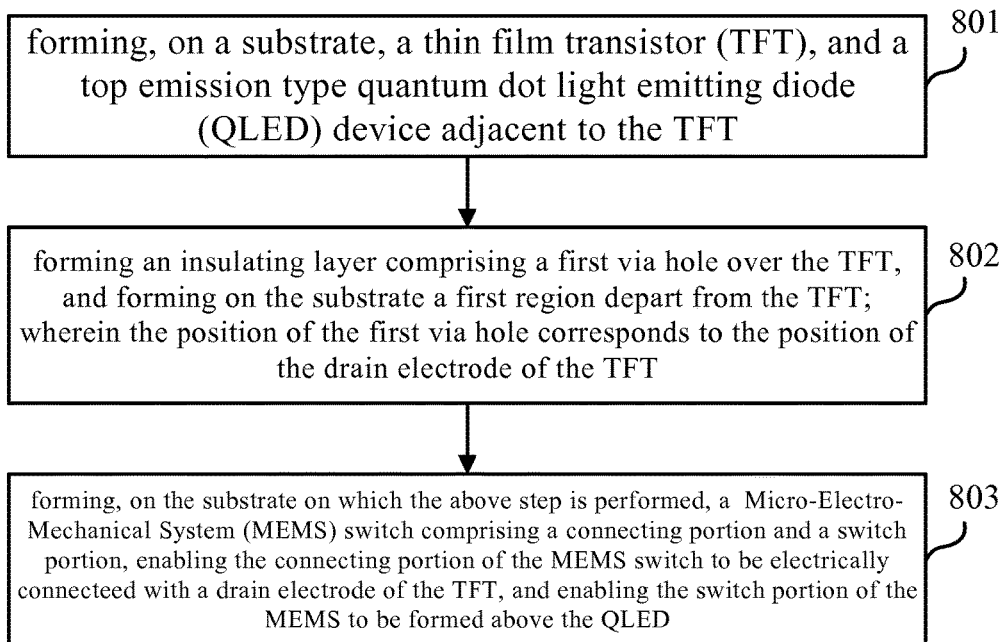
FIG. 8 is a flow chart of a method for preparing a pixel structure provided by the embodiment of the present disclosure.

Referring to FIG. 8, the embodiment of the present disclosure provides a method for preparing a pixel structure, comprising:

Step 801, forming, on a substrate, a thin film transistor (TFT), and a top emission type quantum dot light emitting diode (QLED) device adjacent to the TFT.

The TFT may be a bottom gate type, a top gate type or other structure. For example, a first TFT structure is provided, this TFT is a bottom gate type, comprising a gate metal layer, a gate insulating layer, an active layer, a source-drain metal layer formed on the substrate successively; for another example, a second TFT structure is provided, this TFT is a top gate type, comprising a source-drain metal layer, an active layer, a gate insulating layer and a gate metal layer formed on the substrate successively; for a further example, a third TFT structure is provided, the TFT is a top gate type, comprising an ohmic contact layer, an active layer, a gate insulating layer, a gate metal layer, a passivation layer and a source-drain metal layer formed on the substrate successively, such a structure takes the ohmic contact layer as the medium for contact of the source-drain metal layer and the active layer, hence, it can improve the TFT property effectively and reduce parasitic capacitance between the source-drain metal layer and the gate metal layer. The QLED device may comprise an anode, a hole injection layer, a hole transport layer, a QLED light emitting layer, an electron injection layer, an electron transport layer and a cathode formed on the substrate successively. The specific preparation method is slightly different based on different structures of the TFT.

After forming the TFT on the substrate, it generally comprises:

Step 802, forming an insulating layer comprising a first via hole over the TFT, and forming on the substrate a first region depart from the TFT; wherein the position of the first via hole corresponds to the position of the drain electrode of the TFT. As for the first TFT structure and the second TFT structure, the insulating layer may be one of a passivation layer and a planarization layer or a combination thereof generally. As for the third TFT structure, the insulating layer may be a planarization layer generally. It should be noted that for the third TFT structure, since the source-drain metal layer of the TFT is at the uppermost, the source electrode and the drain electrode of the TFT are connected with the ohmic contact layer through the via hole, hence, the subsequently prepared MEMS switch can be electrically connected with the drain electrode of the TFT directly, thereby omitting the insulating layer.

In the case of considering a better conductivity or reducing the preparation difficulty, optionally, for the preparation of the pixel structure using the first TFT, a first conductive structure electrically connected with the drain electrode of the TFT can be formed over the insulating layer, which enables the connecting portion of the MEMS switch to be electrically connected with the drain electrode of the TFT through the first conductive structure, such that when the connecting portion of the MEMS switch is prepared subsequently, it does not have to consider extending into the layer where the drain electrode of the TFT locates, which reduces the preparation difficulty and also has a better conductive performance.

Since the subsequently prepared MEMS switch is not absolutely airproof, the phenomenon of light leakage may exist at the side of the MEMS switch, for example, the side of the MEMS switch away from the TFT. Therefore, optionally, it further comprises forming light shielding bars above the QLED, the light shielding bars are located below the edge of a side of the MEMS switch close to the QLED device.

Step 803, forming, on the substrate on which the above step is performed, a Micro-Electro-Mechanical System (MEMS) switch comprising a connecting portion and a switch portion, enabling the connecting portion of the MEMS switch to be electrically connected with a drain electrode of the TFT, and enabling the switch portion of the MEMS to be formed above the QLED.

The beneficial effect of the embodiment of the present disclosure is as follows: a MEMS switch is added in the pixel structure, the MEMS switch is electrically connected with the first conductive structure, the first conductive structure is electrically connected with the drain electrode of the TFT through the first via hole, thereby enabling the MEMS switch to be electrically connected with the drain electrode of the TFT; when the display device works, the QLED device emits light constantly, the TFT controls the light emission amount of the outgoing light of the QLED device by controlling the switching amplitude of the MEMS switch, so as to avoid frequent flicker of the QLED device and increase the life time of the QLED device; The display of the QLED display device is controlled through switching of the MEMS switch, hence, the current compensation is not needed to adjust the brightness of the QLED display device, the complex current compensation circuit can be omitted, so that the preparation difficulty of the QLED device is reduced.

Embodiment V

Figure 9:
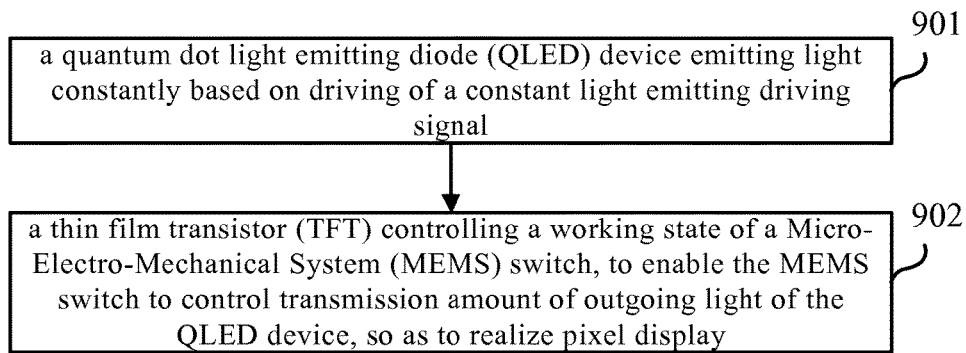
FIG. 9 is a flow chart of a pixel display method provided by the embodiment of the present disclosure.

Referring to FIG. 9, the embodiment of the present disclosure provides a pixel display method, comprising:

Step 901, a quantum dot light emitting diode (QLED) device emitting light constantly based on driving of a constant light emitting driving signal.

Step 902, a thin film transistor (TFT) controlling a working state of a Micro-Electro-Mechanical System (MEMS) switch, to enable the MEMS switch to control transmission amount of outgoing light of the QLED device, so as to realize pixel display.

Optionally, in step 902, the TFT controlling the working state of the MEMS switch to enable the MEMS switch to control transmission amount of outgoing light of the QLED device comprises:

transmitting an image data signal received by a source electrode of the TFT to the connecting portion of the MEMS switch via the drain electrode of the TFT and the first conductive structure successively, to enable the switch portion of the MEMS switch to open a switching amplitude matching with the image data signal, so as to control light amount of outgoing light of the QLED device.

The beneficial effect of the embodiment of the present disclosure is as follows: a MEMS switch is added in the pixel structure, the MEMS switch is electrically connected with the first conductive structure; when the display device works, the QLED device emits light constantly, the TFT controls the working state of the MEMS switch, to control transmission amount of the outgoing light of the QLED device, so as to avoid frequent flicker of the QLED device and increase the life time of the QLED device.

Apparently, the skilled person in the art can make various amendments and variations to the embodiments of the present application without departing from the spirit and scope of the present application. In this way, provided that these modifications and variations of the present application belong to the scopes of the claims of the present application and the equivalent technologies thereof, the present application also intends to cover these modifications and variations.

The invention claimed is:

1. A pixel structure, comprising:
a quantum dot light emitting diode QLED device;
a Micro-Electro-Mechanical System MEMS switch located directly on a light exit surface of the quantum dot light emitting diode QLED device; and
a thin film transistor TFT for controlling the Micro-Electro-Mechanical System MEMS switch;
wherein the Micro-Electro-Mechanical System MEMS switch is used for controlling transmission amount of outgoing light of the quantum dot light emitting diode QLED device, thereby avoiding frequent flicker of the quantum dot light emitting diode QLED device;
wherein the quantum dot light emitting diode QLED device is a top emission type for emitting light constantly based on a constant light emitting driving signal;
and wherein a drain electrode of the TFT is electrically connected with the MEMS switch; the TFT, after being turned on, controls the MEMS switch based on a signal received by a source electrode of the TFT.

2. The pixel structure as claimed in claim 1, wherein the MEMS switch comprises a connecting portion and a switch portion, the connecting portion being electrically connected with the drain electrode of the TFT, the switch portion being arranged at a side in a light emission direction of the QLED device to control light amount of the outgoing light of the QLED device.

3. The pixel structure as claimed in claim 2, wherein the pixel structure further comprises light shielding bars, the light shielding bars being located below an edge of a side of the MEMS switch close to the QLED device.

4. An array substrate comprising a plurality of pixel units arranged in an array, wherein each of the pixel units adopts a pixel structure as claimed in claim 2.

5. The pixel structure as claimed in claim 3, wherein the pixel structure further comprises a first conductive structure through which the MEMS switch is electrically connected with the drain electrode of the TFT.

6. An array substrate comprising a plurality of pixel units arranged in an array, wherein each of the pixel units adopts a pixel structure as claimed in claim 3.

7. The pixel structure as claimed in claim 5, wherein an insulating layer is arranged between the drain electrode of the TFT and the connecting portion of the MEMS switch, the first conductive structure is electrically connected with the drain electrode of the TFT through a first via hole on the insulating layer.

8. An array substrate comprising a plurality of pixel units arranged in an array, wherein each of the pixel units adopts a pixel structure as claimed in claim 5.

9. The pixel structure as claimed in claim 7, wherein the light shielding bars and the first conductive structure are arranged in the same layer and are insulated from each other, materials of the first conductive structure and the light shielding bars are metal materials.

10. An array substrate comprising a plurality of pixel units arranged in an array, wherein each of the pixel units adopts a pixel structure as claimed in claim 7.

11. An array substrate comprising a plurality of pixel units arranged in an array, wherein each of the pixel units adopts a pixel structure as claimed in claim 9.

12. An array substrate comprising a plurality of pixel units arranged in an array, wherein each of the pixel units adopts a pixel structure as claimed in claim 1.

13. A method for preparing a pixel structure, comprising:
forming, on a substrate, a thin film transistor TFT and a top emission type quantum dot light emitting diode QLED device adjacent to the TFT;
forming, on the substrate on which the above step is performed, a Micro-Electro-Mechanical System MEMS switch comprising a connecting portion and a switch portion, enabling the connecting portion of the MEMS switch to be electrically connected with a drain electrode of the TFT, and enabling the switch portion of the MEMS to be formed above the QLED.

14. The method as claimed in claim 13, wherein after forming the TFT on the substrate, further comprising:
forming an insulating layer comprising a first via hole over the TFT, and forming, on the substrate, a first region spaced apart from the TFT; wherein position of the first via hole corresponds to position of the drain electrode of the TFT.

15. The method as claimed in claim 14, wherein further comprising forming a first conductive structure electrically connected with the drain electrode of the TFT over the insulating layer;
enabling the connecting portion of the MEMS switch to be electrically connected with the drain electrode of the TFT is specifically: enabling the connecting portion of the MEMS switch to be electrically connected with the drain electrode of the TFT through the first conductive structure.

16. The method as claimed in claim 15, wherein before forming a MEMS switch comprising a connecting portion and a switch portion, further comprising:
forming light shielding bars above the QLED, the light shielding bars being located below an edge of a side of the MEMS switch close to the QLED device.

17. A pixel display method, comprising:
emitting light constantly from a quantum dot light emitting diode QLED device based on driving of a constant light emitting driving signal;
controlling a working state of a Micro-Electro-Mechanical System MEMS switch located directly on a light exit surface of the quantum dot light emitting diode QLED device, by a thin film transistor TFT, to enable the MEMS switch to control transmission amount of outgoing light of the QLED device, so as to realize pixel display;
wherein the step of controlling the working state of the MEMS switch by the thin film transistor TFT comprises:
transmitting an image data signal received by a source electrode of the TFT to the connecting portion of the MEMS switch via the drain electrode of the TFT and the first conductive structure successively, to enable the switch portion of the MEMS switch to open a switching amplitude matching with the image data signal, so as to control light amount of outgoing light of the QLED device, thereby avoiding frequent flicker of the QLED device.

* * * * *